United States Patent
Setija et al.

(10) Patent No.: US 7,643,666 B2
(45) Date of Patent: Jan. 5, 2010

(54) METHOD AND APPARATUS FOR ANGULAR-RESOLVED SPECTROSCOPIC LITHOGRAPHY CHARACTERIZATION

(75) Inventors: Irwan Dani Setija, Utrecht (NL); Arie Jeffrey Den Boef, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 721 days.

(21) Appl. No.: 11/500,496

(22) Filed: Aug. 8, 2006

(65) Prior Publication Data
US 2008/0069430 A1    Mar. 20, 2008

(51) Int. Cl.
G06K 9/00    (2006.01)
G01B 11/02    (2006.01)

(52) U.S. Cl. .................. 382/144; 356/635
(58) Field of Classification Search .......... 382/144; 356/635
See application file for complete search history.

(56) References Cited

U.S. PATENT DOCUMENTS

| | | | | |
|---|---|---|---|---|
| 5,607,800 A * | 3/1997 | Ziger | | 430/8 |
| 5,703,692 A | 12/1997 | McNeil et al. | | 356/445 |
| 5,835,225 A * | 11/1998 | Thakur | | 356/630 |
| 5,867,276 A * | 2/1999 | McNeil et al. | | 356/445 |
| 5,880,838 A | 3/1999 | Marx et al. | | 356/351 |
| 5,963,329 A * | 10/1999 | Conrad et al. | | 356/613 |
| 6,608,690 B2 * | 8/2003 | Niu et al. | | 356/635 |
| 6,699,624 B2 | 3/2004 | Niu et al. | | 430/5 |
| 6,704,661 B1 | 3/2004 | Opsal et al. | | 702/27 |
| 6,721,691 B2 | 4/2004 | Bao et al. | | 702/189 |
| 6,738,138 B2 | 5/2004 | Wei | | 356/369 |
| 6,753,961 B1 | 6/2004 | Norton et al. | | 356/364 |
| 6,768,983 B1 | 7/2004 | Jakatdar et al. | | 706/46 |
| 6,772,084 B2 | 8/2004 | Bischoff et al. | | 702/127 |
| 6,778,746 B2 * | 8/2004 | Charlton et al. | | 385/122 |
| 6,785,638 B2 | 8/2004 | Niu et al. | | 702/189 |
| 6,813,034 B2 | 11/2004 | Rosencwaig et al. | | 356/601 |
| 6,819,426 B2 | 11/2004 | Sezginer et al. | | 356/401 |
| 6,856,408 B2 | 2/2005 | Raymond | | 356/601 |
| 6,919,964 B2 | 7/2005 | Chu | | 356/601 |
| 6,928,628 B2 | 8/2005 | Seligson et al. | | 716/4 |
| 6,972,852 B2 | 12/2005 | Opsal et al. | | 356/625 |

(Continued)

FOREIGN PATENT DOCUMENTS

EP    1 628 164 A2    2/2006

OTHER PUBLICATIONS

Mark Davidson et al., "A comparison between rigorous light scattering methods," Proceedings of the SPIE, The International Society for Optical Engineering, vol. 3051, (1997), p. 606-619.

*Primary Examiner*—Bhavesh M Mehta
*Assistant Examiner*—Hadi Akhavannik
(74) *Attorney, Agent, or Firm*—Sterne, Kessler, Goldstein & Fox P.L.L.C.

(57) ABSTRACT

Reconstruction of an object by which radiation is diffracted is disclosed. Specifically, the reconstruction includes: estimating the object shape; deriving a model diffraction pattern from the estimated shape; illuminating the object with radiation; detecting a diffraction pattern of radiation diffracted by the object; comparing the model diffraction pattern and the detected diffraction pattern; and determining the actual object shape from the difference between the model diffraction pattern and the detected diffraction pattern, wherein the model diffraction pattern is determined using Bloch Mode Expansion.

16 Claims, 13 Drawing Sheets

U.S. PATENT DOCUMENTS

| | | | |
|---|---|---|---|
| 6,974,962 B2 | 12/2005 | Brill et al. | 250/548 |
| 6,987,572 B2 | 1/2006 | Lakkapragada et al. | 356/601 |
| 7,046,376 B2 | 5/2006 | Sezginer | 356/601 |
| 7,061,615 B1 | 6/2006 | Lowe-Webb | 356/401 |
| 7,061,623 B2 | 6/2006 | Davidson | 356/497 |
| 7,061,627 B2 | 6/2006 | Opsal et al. | 356/601 |
| 7,068,363 B2 | 6/2006 | Bevis et al. | 356/237.5 |
| 2004/0119970 A1 | 6/2004 | Dusa et al. | 356/237.1 |
| 2006/0033921 A1 | 2/2006 | Den Boef et al. | 356/446 |
| 2006/0066855 A1 | 3/2006 | Den Boef et al. | 356/401 |
| 2006/0126074 A1 | 6/2006 | Van Der Werf et al. | 356/489 |
| 2006/0139592 A1 | 6/2006 | Den Boef et al. | 355/53 |

\* cited by examiner

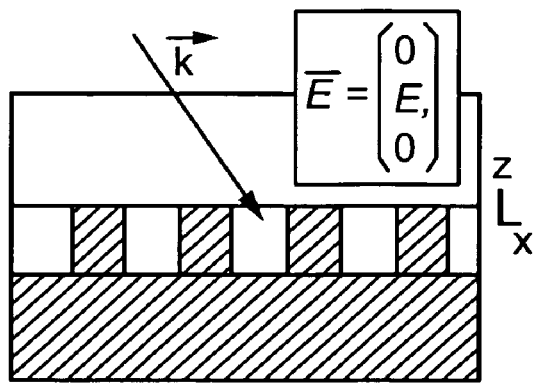
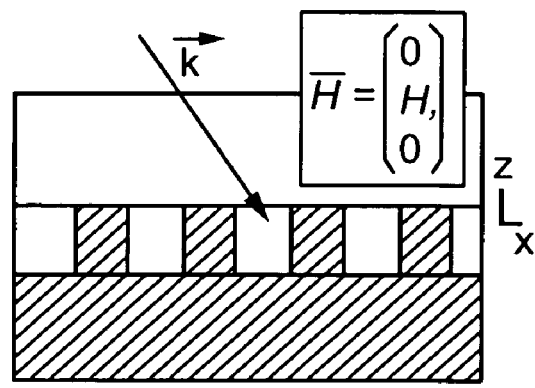
Fig. 11A              Fig. 11B
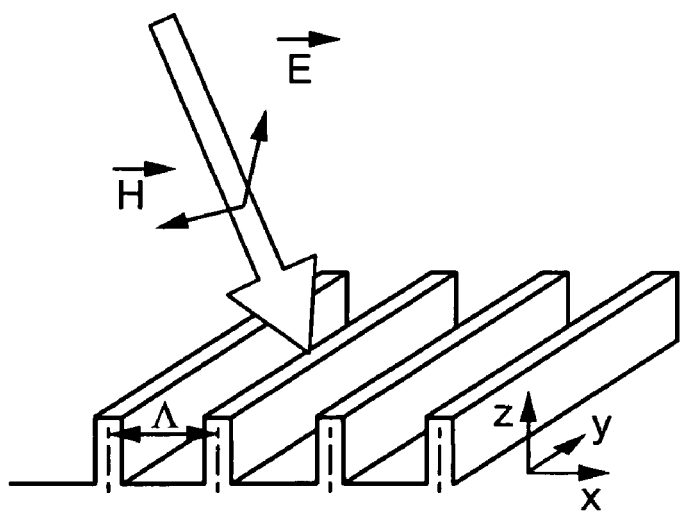
Fig. 12

METHOD AND APPARATUS FOR ANGULAR-RESOLVED SPECTROSCOPIC LITHOGRAPHY CHARACTERIZATION

FIELD

The present invention relates to a method of inspection usable, for example, in the manufacture of devices by a lithographic technique and to a method of manufacturing devices using a lithographic technique.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to determine a property of the substrate, such as its alignment, a beam is reflected off the surface of the substrate, for example, at an alignment target or mark, and an image of the reflected beam is created on, for example, a camera. By comparing one or more properties of the beam before and after it has been reflected off the substrate, one or more properties of the substrate can be determined. This can be done, for example, by comparing the reflected beam with data stored in a library of known measurements associated with one or more known substrate properties.

Scatterometry is an active field of research where optical techniques are used to measure subwavelength features of an object. In an embodiment, the apparatus used to measure the subwavelength features is an in-line metrology tool. This metrology tool detects a reflected beam that has been reflected from the surface of a substrate and more specifically from a specific target on the substrate, and from the reflected beam and its different diffraction orders, reconstructs the shape of the target on the substrate. The reconstructed target can then be compared with other data or with an ideal structure and this information may be fed back to the lithographic apparatus in order to correct for defects that might be occurring in the exposure stage. Alternatively or additionally, the information may be fed forward to one or more other processes that are carried out on a substrate in order to compensate for any errors or deviations in the exposure step.

A part of the detection and reconstruction is a numerical algorithm that calculates the diffraction pattern from an arbitrary (or model) target profile. Currently, RCWA (rigorous coupled wave analysis) is used for this purpose. RCWA is a relatively fast algorithm, but may lose its speed on particular target types. This can be a disadvantage for robust calculation of line profiles within an acceptable amount of time. If the calculation of the reconstruction of the target takes too long, a large gap of time is created between a substrate being exposed and any errors being found and compensated for. Ideally, any errors should be found as the substrate is on its way to the next process so that the information can be fed forward in time to correct for errors in the same substrate that has just been exposed and measured.

SUMMARY

It is desirable, for example, to provide an improved reconstruction model that can quickly and efficiently reconstruct a target on a substrate from a reflected spectrum such that substrate processing time may be reduced and throughput increased.

According to an aspect of the invention, there is provided a method of reconstructing a shape of an object from a diffraction pattern of radiation illuminating the object, the method comprising:

estimating the object shape;

deriving a model diffraction pattern from the estimated shape;

comparing the model diffraction pattern and the detected diffraction pattern; and determining the actual object shape from the difference between the model diffraction pattern and the detected diffraction pattern, wherein the model diffraction pattern is determined using Bloch Mode Expansion.

There is also provided a computer program, an inspection apparatus and a lithographic cell arranged to carry out the method.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 11a and FIG. 11b depict the application of an embodiment of the present invention to different polarizations;

FIG. 12 depicts the application of the model of an embodiment of the present invention to conical diffraction.

DETAILED DESCRIPTION

Figure 1A:
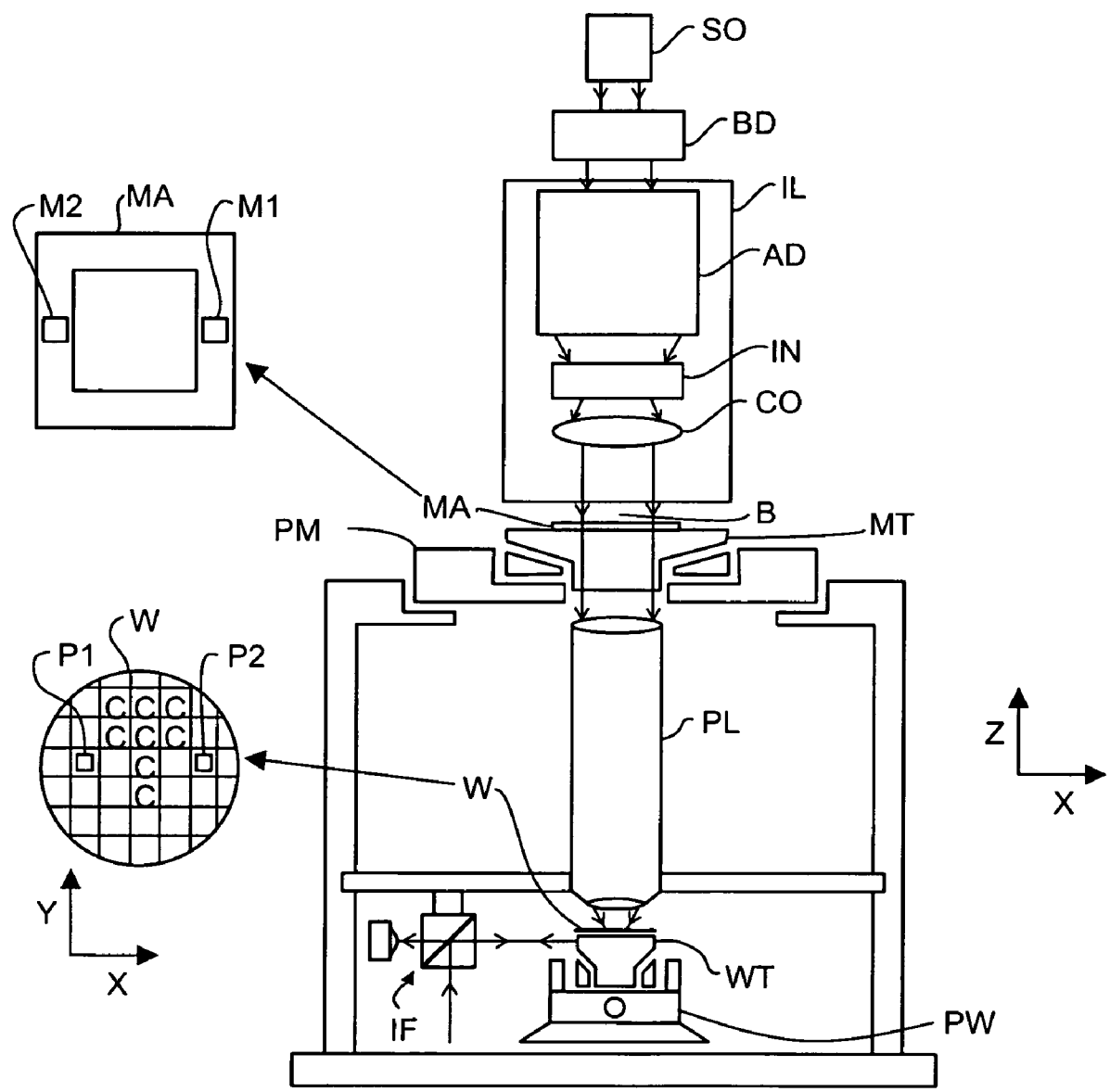
FIG. 1a depicts a lithographic apparatus.

FIG. 1a schematically depicts a lithographic apparatus. The apparatus comprises:

an illumination system (illuminator) IL configured to condition a radiation beam B (e.g. UV radiation or EUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1a, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PL, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1a) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment targets M1, M2 and substrate alignment targets P1, P2. Although the substrate alignment targets as illustrated occupy dedicated target portions, they may be located in spaces between target portions (these are known as scribe-lane alignment targets). Similarly, in situations in which more than one die is provided on the patterning device MA, the patterning device alignment targets may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 1B:
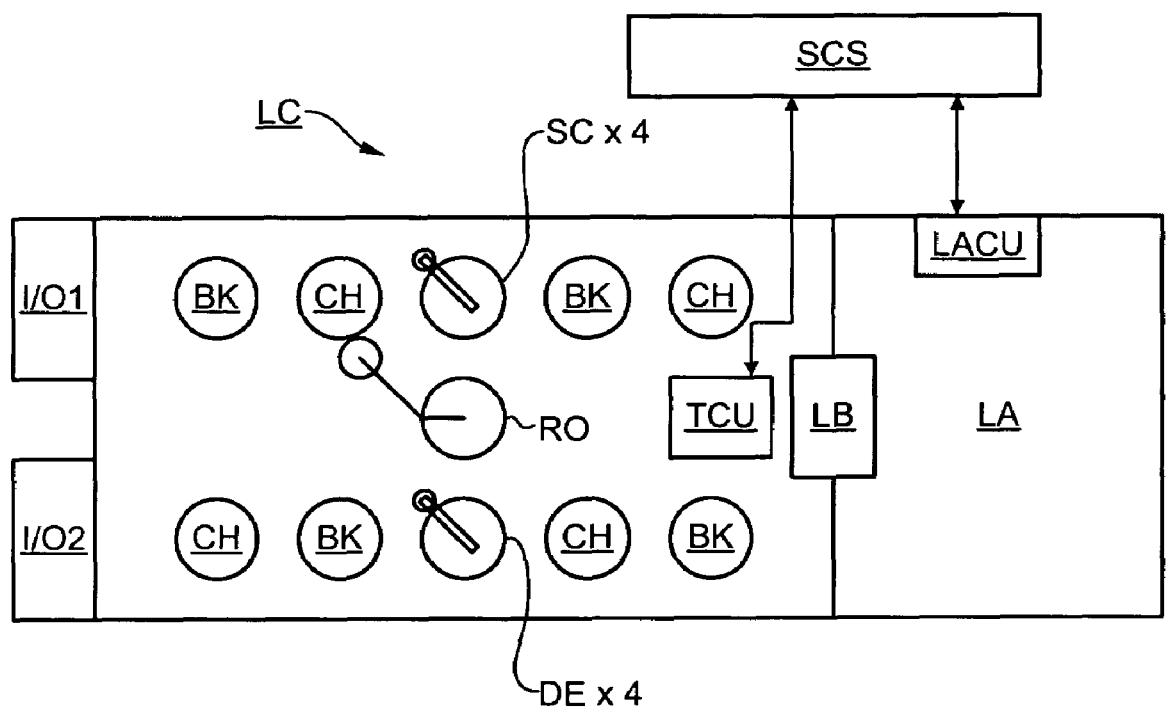
FIG. 1b depicts a lithographic cell or cluster.

As shown in FIG. 1b, the lithographic apparatus LA forms part of a lithographic cell LC, also sometimes referred to a lithocell or cluster, which also includes apparatus to perform one or more pre- and post-exposure processes on a substrate. Conventionally these include one or more spin coaters SC to deposit resist layers, one or more developers DE to develop exposed resist, one or more chill plates CH and one or more bake plates BK. A substrate handler, or robot, RO picks up substrates from input/output ports I/O1, I/O2, moves them between the different process devices and delivers them to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that a substrate that is exposed by the lithographic apparatus is exposed correctly and consistently, it is desirable to inspect one or more exposed substrates to measure one or more properties, such as overlay error between subsequent layers, line thicknesses, critical dimensions (CD), etc. If errors are detected, an adjustment may be made to exposure of one or more subsequent substrates, especially if the inspection can be done soon and fast enough that one or more other substrates of the same batch are still to be exposed. Also, one or more already exposed substrates may be stripped and reworked—to improve yield—or discarded—thereby avoiding performing exposure on a substrate that is known to be faulty. In a case where only one or more target portions of a substrate are faulty, further exposure can be performed only on those one or more target portions that are good.

An inspection apparatus is used to determine one or more properties of a substrate, and in particular, how the one or more properties of different substrates or different layers of the same substrate vary from layer to layer. The inspection apparatus may be integrated into the lithographic apparatus LA or the lithocell LC or may be a stand-alone device. To enable rapid measurement, it is desirable that the inspection apparatus measure one or more properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on an exposed substrate and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of a faulty substrate but may still provide useful information.

Figure 2:
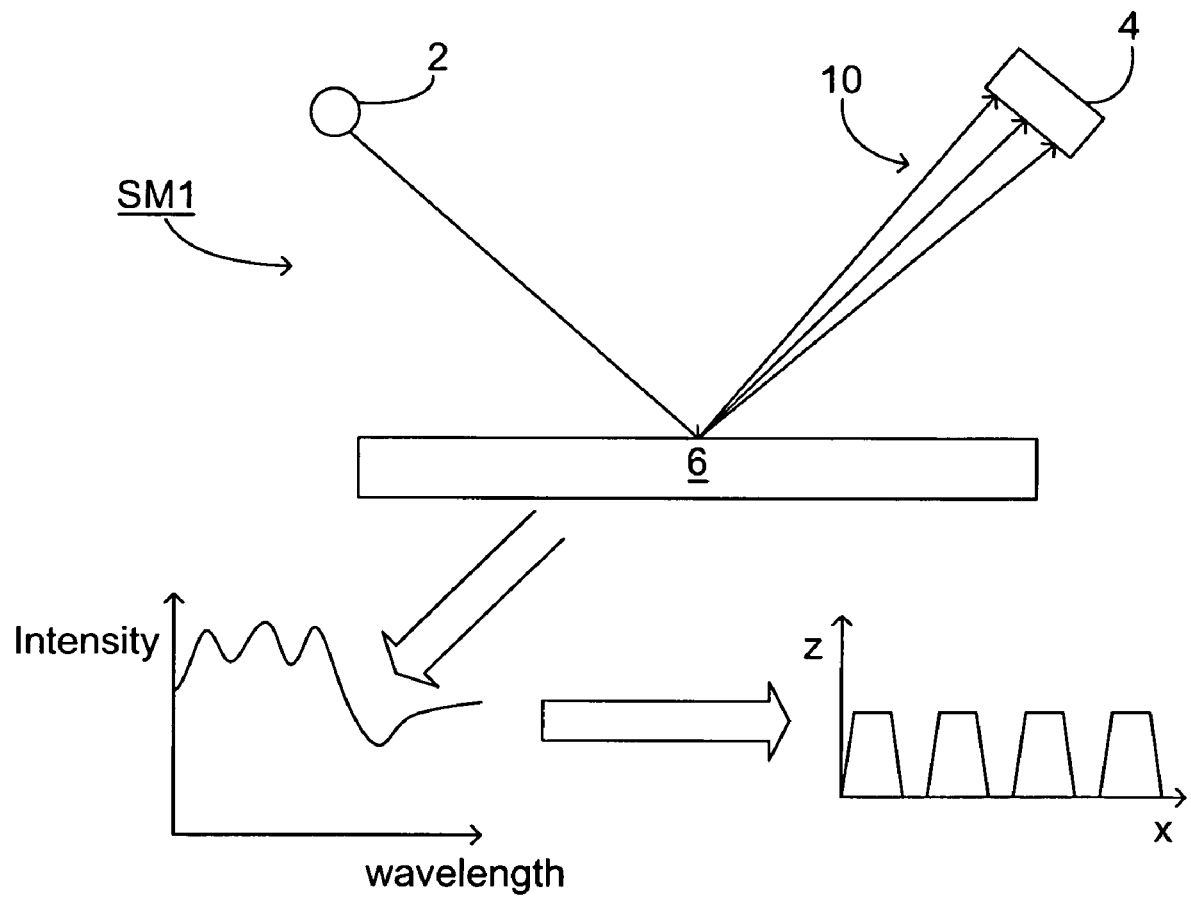
FIG. 2 depicts a scatterometer according to an embodiment of the present invention.

FIG. 2 depicts a scatterometer that may be used in an embodiment of the present invention. It comprises a broadband (white light) radiation projector 2 that projects radiation onto a substrate 6. The reflected radiation is passed to a spectrometer detector 4, which measures a spectrum 10 (intensity as a function of wavelength) of the specular reflected radiation. From this data, the structure or profile giving rise to the detected spectrum may be reconstructed, e.g. by Rigorous Coupled Wave Analysis and non-linear regression or by comparison with a library of simulated spectra as shown at the bottom of FIG. 2. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer. The radiation source 2 may be part of the scatterometer or may simply be conduit of radiation from an outside radiation generator.

Figure 3:
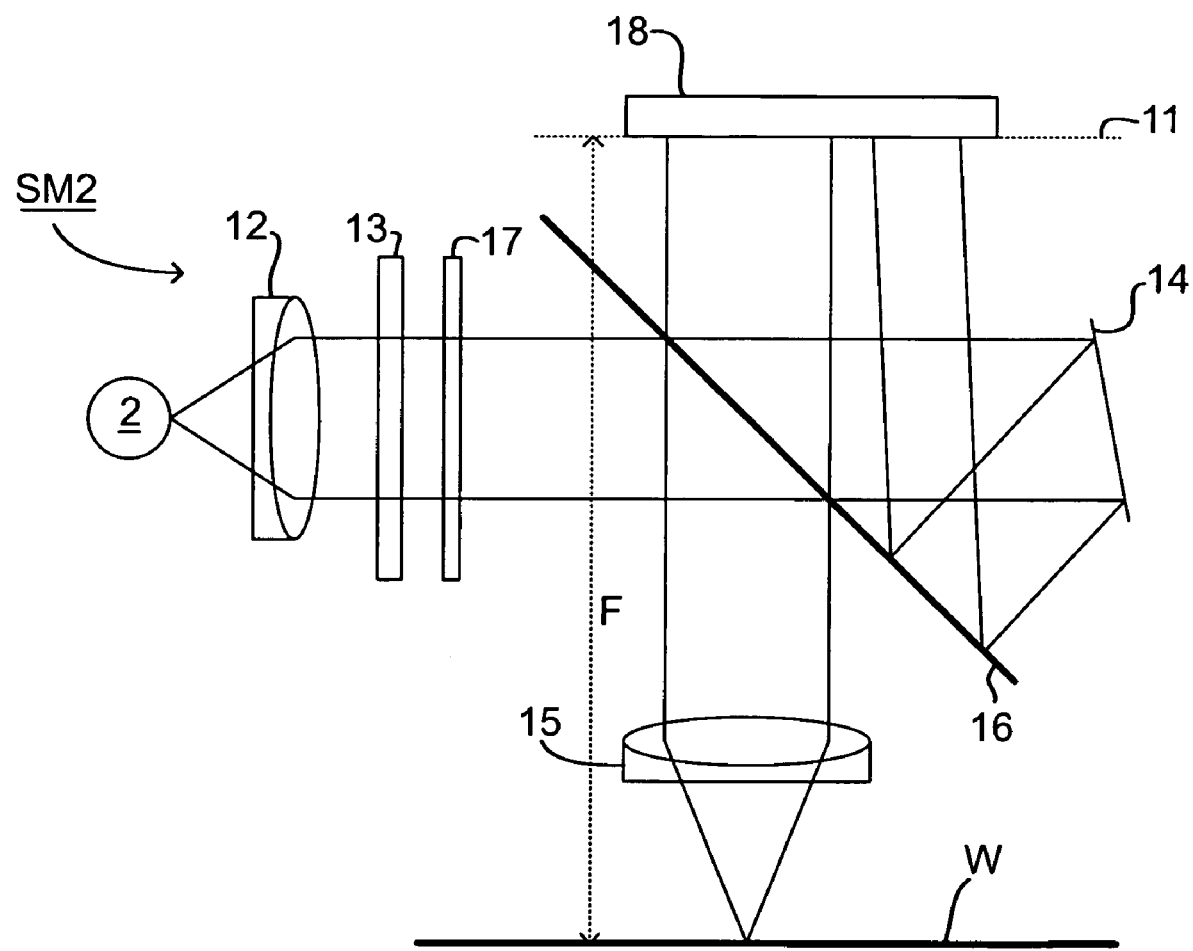
FIG. 3 shows an alternative scatterometer according to an embodiment of the present invention.

Another scatterometer that may be used with an embodiment of the present invention is shown in FIG. 3. In this device, the radiation emitted by radiation source 2 is focused using lens system 12 through interference filter 13 and polarizer 17, reflected by partially reflective surface 16 and is focused onto substrate W via a microscope objective lens 15, which has a high numerical aperture (NA), in an embodiment at least 0.9 or at least 0.95. An immersion scatterometer may even have a lens with a numerical aperture over 1. The reflected radiation then transmits through partially reflective surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector. The pupil plane is the plane in which the radial position of radiation defines the angle of incidence and the angular position defines the azimuth angle of the radiation. In an embodiment, the detector is a two-dimensional detector so that a two-dimensional angular scatter spectrum of the substrate target can be measured. The detector 18 may be, for example, an array of CCD or CMOS sensors, and may use an integration time of, for example, 40 milliseconds per frame. The radiation source 2 may be part of the scatterometer or may simply be conduit of radiation from an outside radiation generator.

A reference beam is often used for example to measure the intensity of the incident radiation. To do this, when the radiation beam is incident on the partially reflective surface 16 part of it is transmitted through the partially reflective surface as a reference beam towards a reference mirror 14. The reference beam is then projected onto a different part of the same detector 18.

A set of interference filters 13 is available to select a wavelength of interest in the range of, say, 405-790 nm or even lower, such as 200-300 nm. The interference filter may be tunable rather than comprising a set of different filters. A grating could be used instead of one or more interference filters.

The detector 18 may measure the intensity of scattered radiation at a single wavelength (or narrow wavelength range), the intensity separately at multiple wavelengths or the intensity integrated over a wavelength range. Furthermore, the detector may separately measure the intensity of transverse magnetic- and transverse electric-polarized radiation and/or the phase difference between the transverse magnetic- and transverse electric-polarized radiation.

Using a broadband radiation source (i.e. one with a wide range of radiation frequencies or wavelengths—and therefore of colors) is possible, which gives a large etendue, allowing the mixing of multiple wavelengths. For the plurality of wavelengths in the broadband, each preferably has a bandwidth of *8 and a spacing of at least 2*8 (i.e. twice the wavelength). Several "sources" of radiation may be different portions of an extended radiation source which have been split using fiber bundles. In this way, angle resolved scatter spectra may be measured at multiple wavelengths in parallel. A 3-D spectrum (wavelength and two different angles) may be measured, which contains more information than a 2-D spectrum. This allows more information to be measured which increases metrology process robustness. This is described in more detail in European patent application publication EP1,628,164A.

The target on substrate W may be a grating that is printed such that after development, the bars are formed of solid resist lines. The bars may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed grating is used to reconstruct the grating. The parameters of the grating, such as line widths and shapes, may be input to the reconstruction process from knowledge of the printing step and/or one or more other scatterometry processes.

As described above, the target is on the surface of the substrate. This target will often take the shape of a series of lines in a grating or substantially rectangular structures in a 2-D array. The purpose of rigorous optical diffraction theories in metrology is effectively the calculation of a diffraction spectrum that is reflected from the target. In other words, target shape information is obtained for CD (critical dimension) uniformity and overlay metrology. Overlay metrology is a measuring system in which the overlay of two targets is measured in order to determine whether two layers on a substrate or aligned or not. CD uniformity is simply a measurement of the uniformity of the grating on the spectrum to determine how the exposure system of the lithographic apparatus is functioning. Specifically, CD, or critical dimension, is the width (e.g. the width of the target shown in FIG. 4) of the object that is "written" on the substrate and is the limit at which a lithographic apparatus is physically able to write on a substrate.

Figure 4:
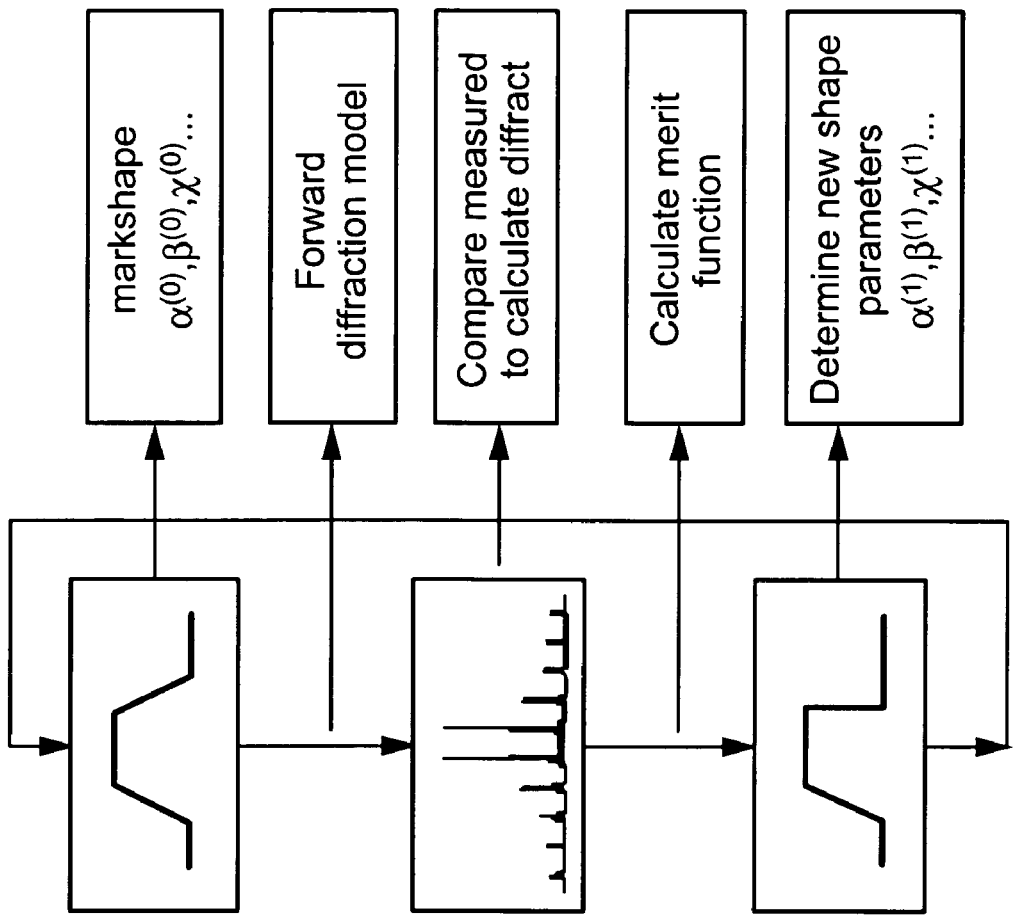
FIG. 4 depicts a method of reconstruction.
Figure 4:
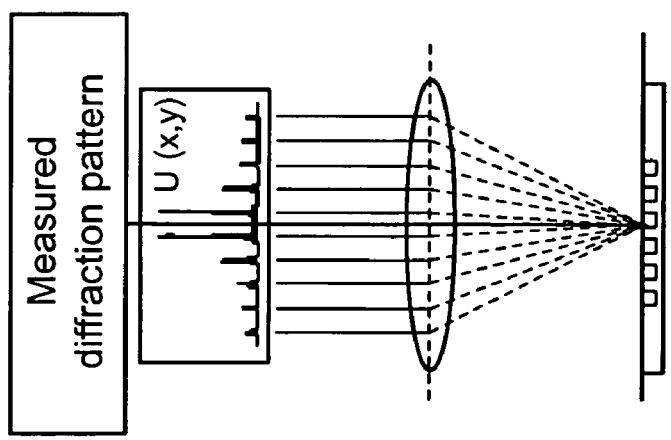

The way the measurement of the target shape (also referred to as the markshape) is carried out is as follows:

1. The target shape is estimated. This may resemble the top shape as shown in FIG. 4. This estimated shape is given different parameters such as $\alpha^{(0)}$, $\beta^{(0)}$, $\chi^{(0)}$, and so on. Each of these parameters may be, for example, the angle of each side wall, the height of the top of the target, the width at the top of the target, the width at the bottom of the target, etc.

2. A rigorous optical diffraction method such as RCWA or Bloch mode expansion (described later) is used to obtain the estimated or model diffraction pattern of the estimated target shape.

3. The diffraction pattern of the actual target on the substrate is then measured by illuminating the target on the substrate with a radiation beam and detecting the diffracted beam, the pattern of which will be dependent on the properties of the target. This measured diffraction pattern and the model diffraction pattern are forwarded to a calculation system such as a computer.

4. The measured diffraction pattern and the model diffraction pattern are then compared and any differences are fed into a "merit function" calculation.

5. Using the merit function, which relates the sensitivity of certain target parameters to the shape of the diffraction pattern, new shape parameters are estimated. This may give a shape that is closer to the bottom shape of FIG. 4 which has new parameters such as $\alpha^{(1)}$, $\beta^{(1)}$, $\chi^{(1)}$, etc.

The computation time of this iterative process is largely determined by the forward diffraction model, i.e. the calculation of the estimated model diffraction pattern using a rigorous optical diffraction theory from the estimated target shape.

In order to calculate the diffraction pattern, at present, RCWA (rigorous coupled wave analysis) is used as described below.

Figure 5:
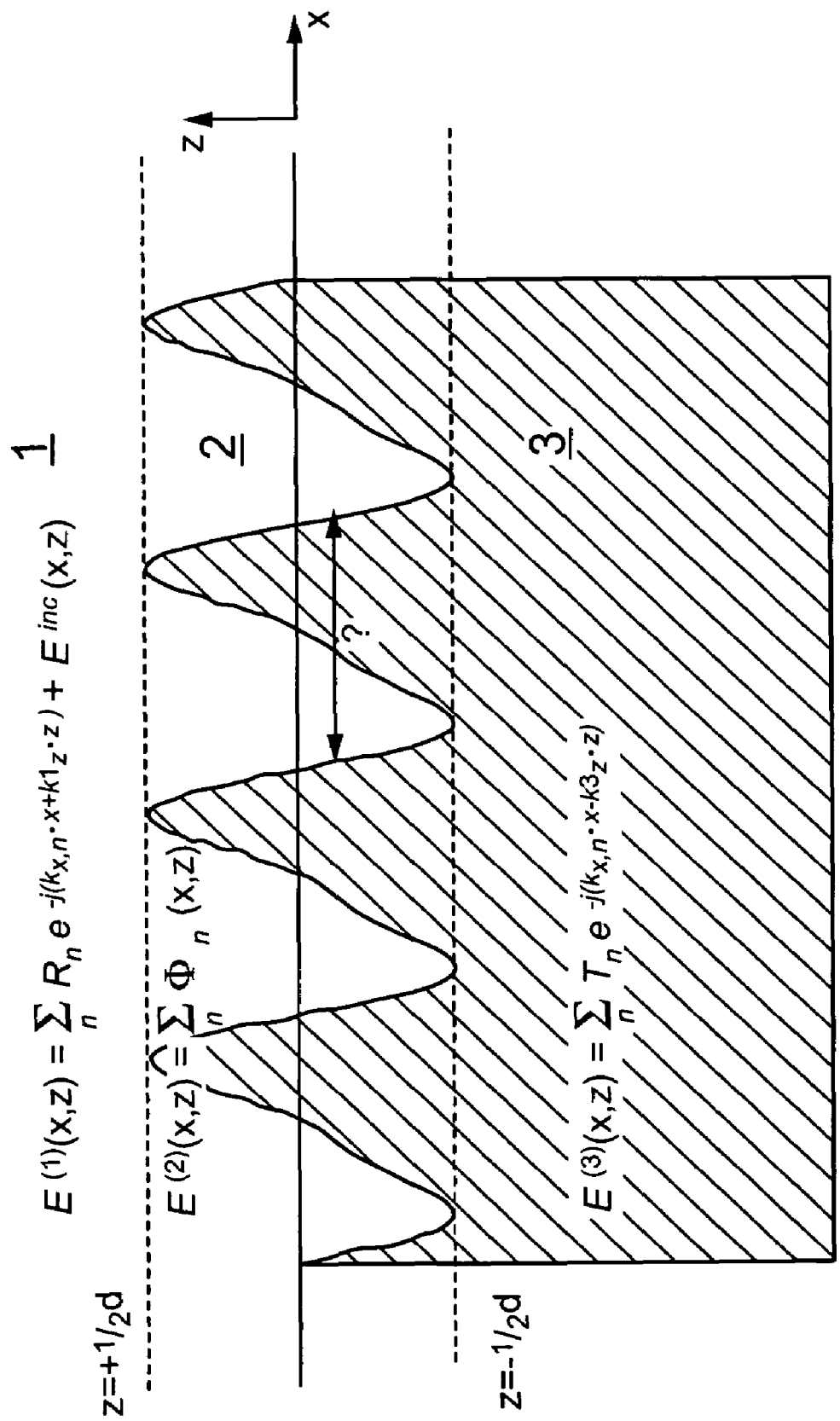
FIG. 5 shows a generic solution to the one-dimensional periodic diffraction grating.

As shown in FIG. 5, the estimated target shape is divided into three sections. The first section (1) has an electric field $E^{(1)}$ which is made up of the reflected field $R_n$ and the incoming fields $E^{inc}$. The boundary condition at z=+½d indicates that the tangential E-field must be continuous and differentiable.

Section or area 3 has an upper boundary condition at z=−½d. The electric field $E^{(3)}$ is made purely of the transmitted field $T_n$.

For sections 1 and 3, the homogeneous wave equation can be used:

$$\left(\frac{\partial^2}{\partial x^2} + \frac{\partial^2}{\partial z^2}\right)E(x, z) + \omega^2 \mu_0 \varepsilon E(x, z) = 0 \qquad (1)$$

$$\omega^2 \mu_0 \varepsilon = n^2 k_0^2$$

The solution of this wave equation is:

$$e^{-j(k_{x,n}x + k_z z)} \qquad (2)$$

where $$k_{x,n} = n_1 k_0 \sin\theta + n\frac{2\pi}{\Lambda} \qquad (3)$$

and $$k_z = \sqrt{n^2 k_0^2 - k_{x,n}^2} \qquad (4)$$

This is reasonably straightforward.

On the other hand, section 2 of FIG. 5 shows an example of a one-dimensional grating. For arbitrary shapes in the grating, the wave equation in section 2 can only be numerically solved. Boundary conditions are applied at z=+½d and z=−½d, i.e. top and bottom boundary conditions. The boundary conditions are as follows:

The continuity of the tangential E (electric) field is shown as:

$$E^{(i)}\left(x, z = \pm \frac{1}{2}d\right) = E^{(j)}\left(x, z = \pm \frac{1}{2}d\right) \quad (5)$$

The derivative of the tangential E-field is also equated:

$$\frac{\partial E^{(i)}}{\partial z}\bigg|_{(x,z=\pm\frac{1}{2}d)} = \frac{\partial E^{(j)}}{\partial z}\bigg|_{(x,z=\pm\frac{1}{2}d)} \quad (6)$$

Figure 6:
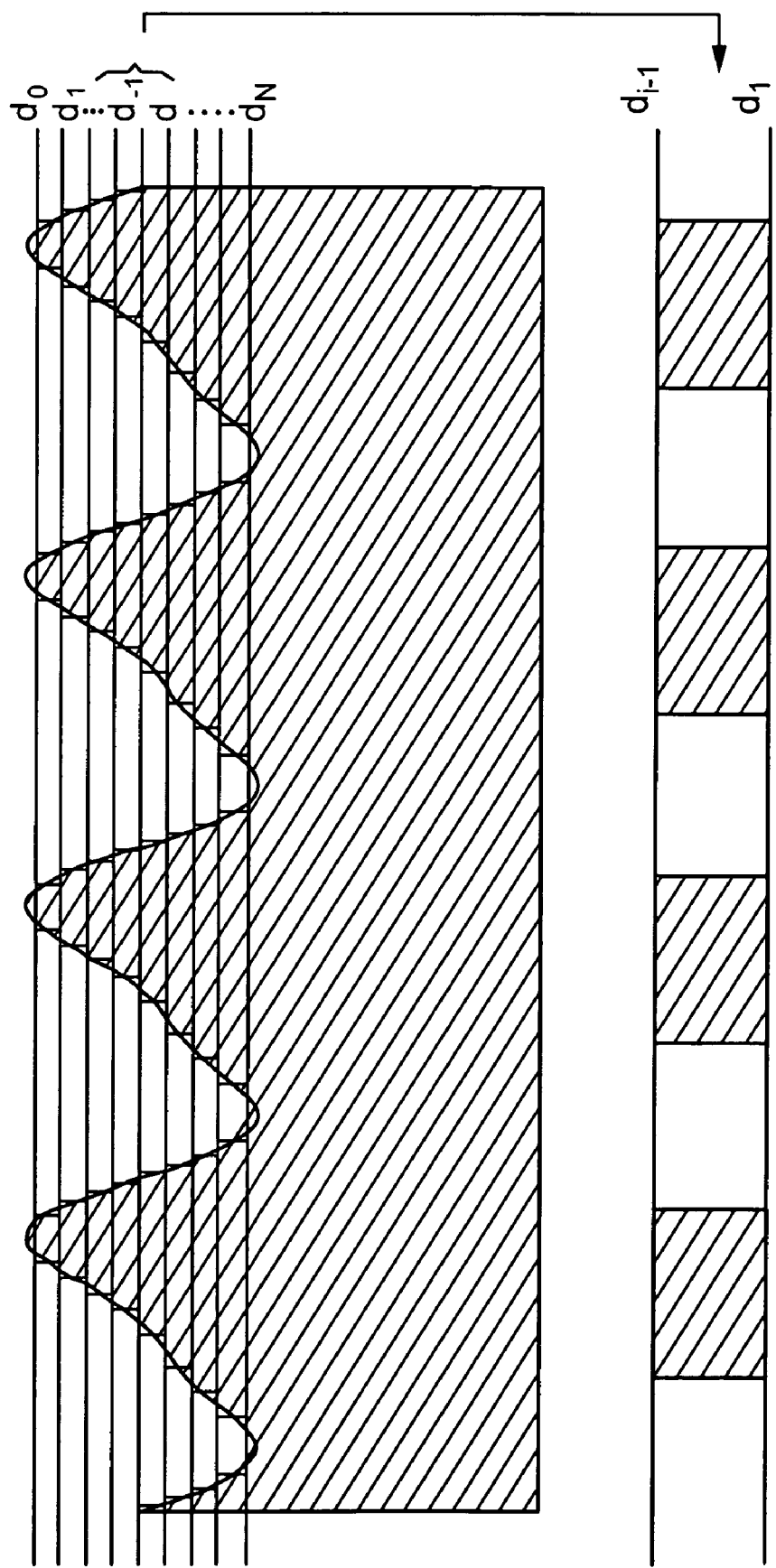
FIG. 6 depicts the multilayer decomposition of the diffraction grating of arbitrary profile.

Having applied the boundary conditions, section 2 of FIG. 5 undergoes a multilayer decomposition as shown in FIG. 6. Specifically, the arbitrary shapes of the grating are divided into several layers $d_0$ to $d_N$. Each of these layers is shown in the bottom of FIG. 6 as a layer comprising a single one-dimensional periodic array of space (e.g., air) and target material. The example shown in FIG. 6 is the layer of $d_{i-1}$ to $d_i$.

Maxwell's equations for a rectangular index profile (or binary grating):

$$\left(\frac{\partial^2}{\partial x^2} + \frac{\partial^2}{\partial z^2}\right)E(x, z) + k_0^2 \varepsilon_r(x) E(x, z) = 0 \quad (7)$$

are then solved by substituting:

$$E(x, z) = \sum_{n=-N}^{N} S_n(z) e^{-jk_{x,n}x} \quad (8)$$

and $$\varepsilon_\gamma(x) = \sum_{g=-2N}^{2N} \tilde{\varepsilon}_g e^{-jkgx} \quad (9)$$

in the wave equation where N is the number of harmonics.

The boundary conditions are applied at each interface $d_i$ and at the interfaces between the grating region, space (e.g., air) and substrate. Through the boundary conditions, the fields in all adjacent layers are connected. This then gives a set of equations from which R and T, the complex reflection and transmission coefficients can be derived.

Figure 7:
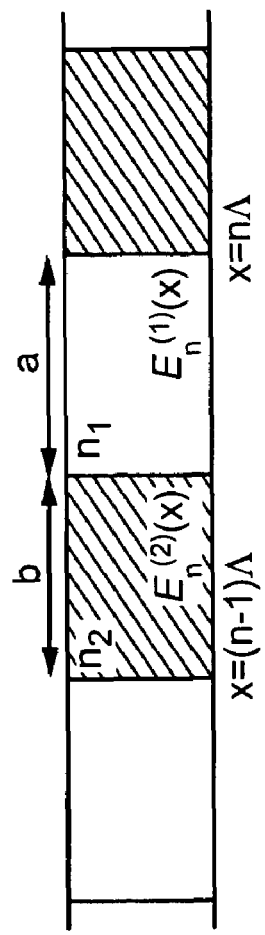
FIG. 7 shows a single period of the binary diffraction grating.

Solving the binary diffraction grating will now be described. FIG. 7 shows a single layer of the diffraction grating. The layer is a periodic single dimensional array of shapes with different refractive indices. a is a section of superstrate material with refractive index $n_1$ and b is a section of grating (or target) material with refractive index $n_2$.

For this single layer, the wave equation is solved by inserting equations (8) and (9) into the wave equation:

$$\begin{pmatrix} \frac{d^2 S_N}{dz^2} \\ \frac{d^2 S_{N-1}}{dz^2} \\ \vdots \\ \frac{d^2 S_0}{dz^2} \\ \vdots \\ \vdots \\ \frac{d^2 S_{-N}}{dz^2} \end{pmatrix} = \begin{pmatrix} (k_{z,N}^2 - \tilde{\varepsilon}_0 k_0^2) & -\tilde{\varepsilon}_1 k_0^2 & \cdots & -\tilde{\varepsilon}_N k_0^2 & \cdots & \cdots & -\tilde{\varepsilon}_{2N} k_0^2 \\ -\tilde{\varepsilon}_{-1} k_0^2 & (k_{z,N-1}^2 - \tilde{\varepsilon}_0 k_0^2) & \cdots & -\tilde{\varepsilon}_{N-1} k_0^2 & \cdots & \cdots & -\tilde{\varepsilon}_{2N-1} k_0^2 \\ \vdots & & & & & & \\ -\tilde{\varepsilon}_{-N} k_0^2 & \cdots & & (k_{z,0}^2 - \tilde{\varepsilon}_0 k_0^2) & \cdots & \cdots & -\tilde{\varepsilon}_N k_0^2 \\ \vdots & & & & & & \\ \vdots & & & & & & \\ -\tilde{\varepsilon}_{-2N} k_0^2 & \cdots & & & & \cdots & (k_{z,-N}^2 - \tilde{\varepsilon}_0 k_0^2) \end{pmatrix} \begin{pmatrix} S_N \\ S_{N-1} \\ \vdots \\ S_0 \\ \vdots \\ \vdots \\ S_{-N} \end{pmatrix} \quad (10)$$

which must be solved for $S_n$ (n=−N, ... N). This procedure is performed for each slab. Increasing the number of harmonics and/or the number of slabs clearly increases the accuracy but also increases the computation required.

An aspect of an embodiment of the present invention is to use the eigenmodes of a medium with a periodically modulated index of refraction. These modes are called Bloch modes. Bloch Mode Expansion (BME) is a technique generally used for determining the radiative properties of photonic crystals. Different homogenous regions will have different wavevectors; e.g. $k_1$ for target material and $k_2$ for the space surrounding the target. Bloch modes for one-dimensional periodic multilayers are known:

$$\Phi_{B,m}(x) = u(x) e^{jK_x} \quad (11)$$

where $$u(x+\Lambda) = u(x) \quad (12)$$

The general solution for the binary diffraction grating is the sum over all Bloch modes.

For the multilayer decomposition, the Bloch modes for each binary diffraction grating are determined and used in the boundary conditions.

For a grating profile where the binary shape parameter "a" does not vary too strongly from slab to slab, the Bloch k-vectors for each slab can be derived from the previous one. In this limit, the Bloch modes need only be determined for the first layer and the Bloch modes of the subsequent layers are determined through interpolation using the first-order derivative of the Bloch mode equation.

For the 1-D periodic multilayer, Bloch modes can be simply derived by applying boundary conditions at:

$$x = (n-1)\Lambda \quad (13)$$

$$x = (n-1)\Lambda + b \quad (14)$$

$$x = n\Lambda \quad (15)$$

Two plain wave solutions in regions with an index of refraction $n_1$ and $n_2$ give a result of:

$$E_n^{(1)}(x) = a_n^{(1)} e^{-jk_1(x-n\Lambda)} + b_n^{(1)} e^{jk_1(x-n\Lambda)}$$

$$E_n^{(2)}(x) = a_n^{(2)} e^{-jk_2(x-n\Lambda)} + b_n^{(2)} e^{jk_2(x-n\Lambda)} \quad (16)$$

and the solutions for each of the boundary conditions are:

$$x = (n-1)\Lambda: \quad (17)$$

$$\begin{pmatrix} a_{n-1}^{(1)} \\ b_{n-1}^{(1)} \end{pmatrix} = \begin{pmatrix} c \cdot a_n^{(2)} + d \cdot b_n^{(2)} \\ e \cdot a_n^{(2)} + f \cdot b_n^{(2)} \end{pmatrix} = M1 \cdot \begin{pmatrix} a_n^{(2)} \\ b_n^{(2)} \end{pmatrix} \quad (18)$$

$$x = (n-1)\Lambda + b: \quad (19)$$

$$\begin{pmatrix} a_n^{(2)} \\ b_n^{(2)} \end{pmatrix} = M2 \cdot \begin{pmatrix} a_n^{(1)} \\ b_n^{(1)} \end{pmatrix} \quad (20)$$

$$x = n\Lambda: \quad (21)$$

$$\begin{pmatrix} a_n^{(1)} \\ b_n^{(1)} \end{pmatrix} = M3 \cdot \begin{pmatrix} a_{n+1}^{(2)} \\ b_{n+1}^{(2)} \end{pmatrix} \quad (22)$$

Combining the matrices of the boundary conditions gives:

$$\begin{pmatrix} a_{n-1}^{(1)} \\ b_{n-1}^{(1)} \end{pmatrix} = \begin{pmatrix} A1 & B1 \\ C1 & D1 \end{pmatrix} \cdot \begin{pmatrix} a_n^{(1)} \\ b_n^{(1)} \end{pmatrix} \quad (23)$$

wherein (24)

$$A1 = e^{jk_1 a}\left[\cos(k_2 b) + \frac{1}{2}j\left(\frac{k_2}{k_1} + \frac{k_1}{k_2}\right)\sin(k_2 b)\right]$$

$$B1 = e^{-jk_1 a}\frac{1}{2}j\left(\frac{k_2}{k_1} - \frac{k_1}{k_2}\right)\sin(k_2 b) \quad (25)$$

$$C1 = \overline{B1} \quad (26)$$

$$D1 = \overline{A1} \quad (27)$$

Inserting the periodic boundary condition:

$$\begin{pmatrix} a_{n-1}^{(1)} \\ b_{n-1}^{(1)} \end{pmatrix} = e^{jK\Lambda} \begin{pmatrix} a_n^{(1)} \\ b_n^{(1)} \end{pmatrix} \quad (28)$$

The eigenvector equation reads:

$$\begin{cases} (A1 - e^{jK\Lambda})a_n^{(1)} + B1 \cdot b_n^{(1)} = 0 \\ C1 \cdot a_n^{(1)} + (D1 - e^{jK\Lambda})b_n^{(1)} = 0 \end{cases} \quad (29)$$

This only has a non-zero solution if:

$$\cos(k_1 a)\cos(k_2 b) - \frac{1}{2}\left(\frac{k_2}{k_1} + \frac{k_1}{k_2}\right)\sin(k_1 a)\sin(k_2 b) = \cos(K\Lambda) \quad (30)$$

Figure 8:
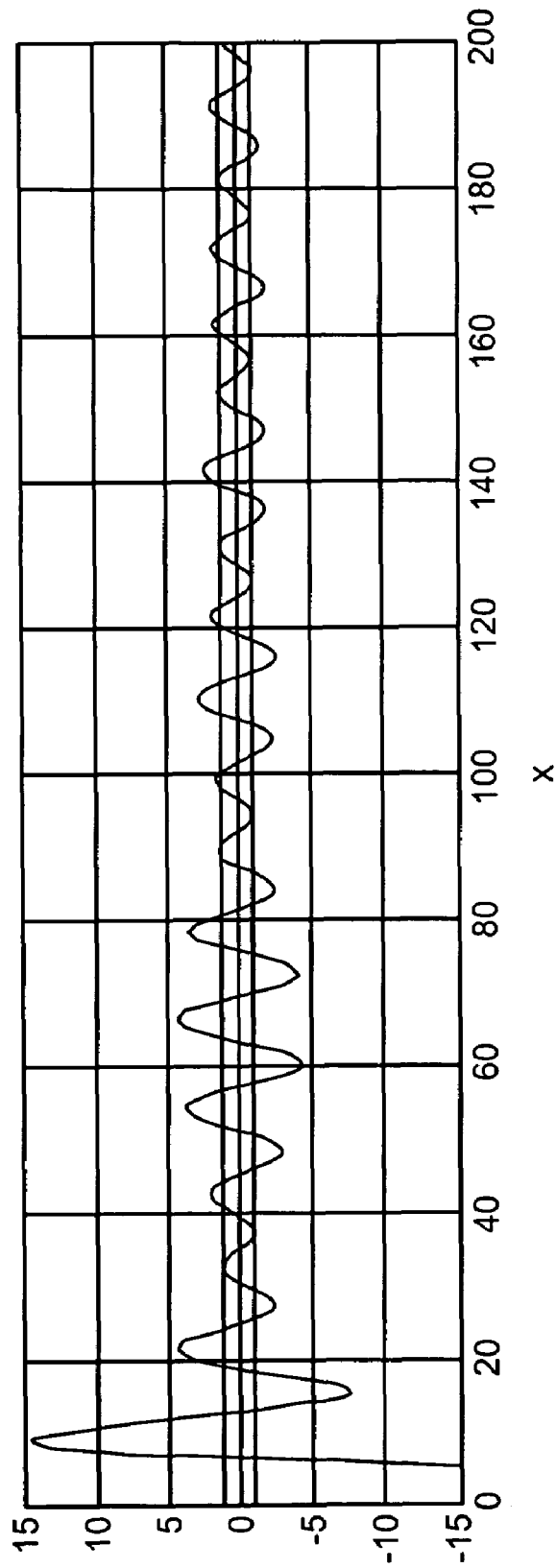
FIG. 8 depicts the transcendental Bloch mode equation that determines the k-vectors.
Figure 9A:
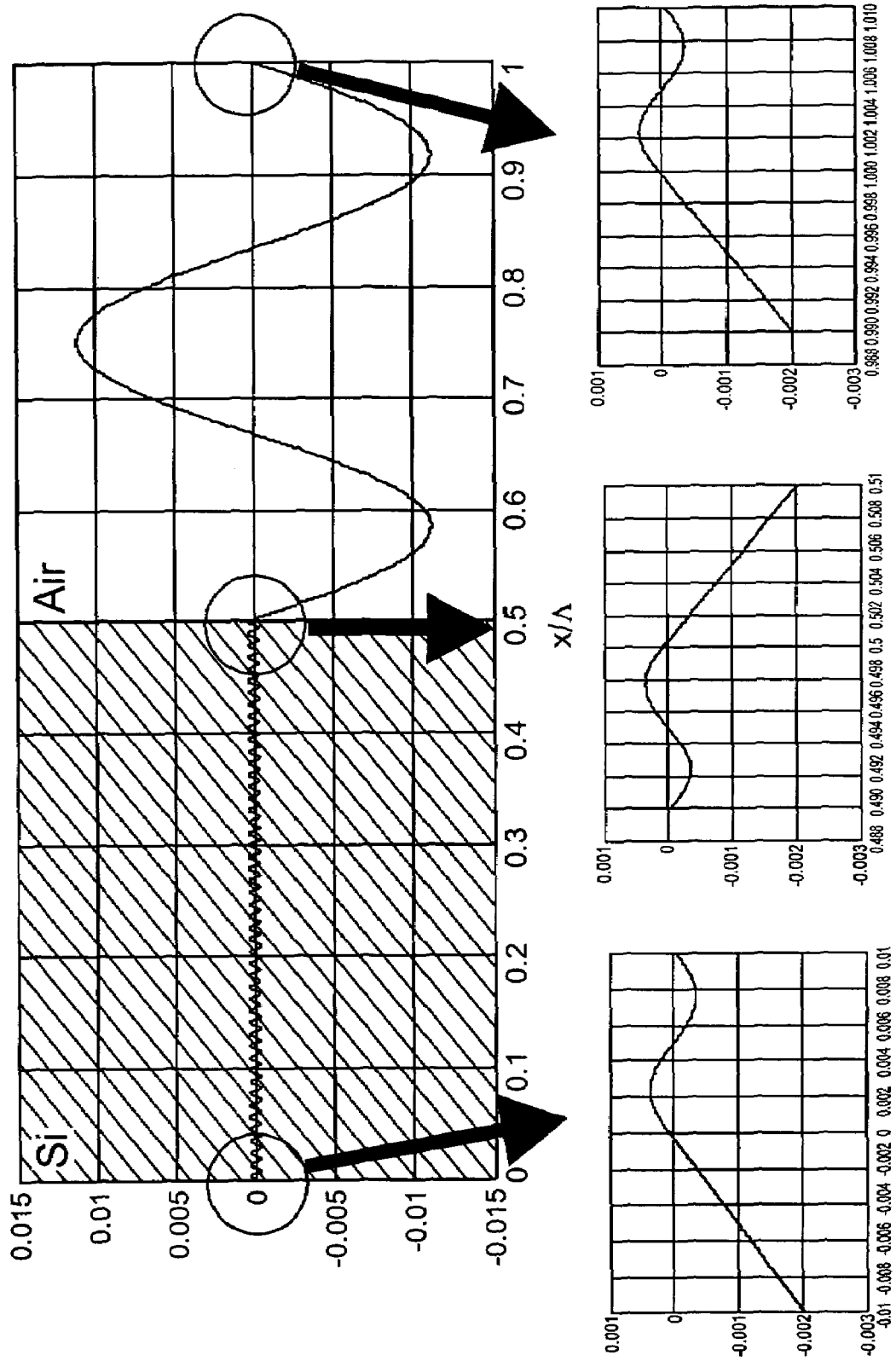
FIG. 9 shows two examples of Bloch modes, solutions to the wave equation for the periodically modulated medium in FIG. 7.
Figure 9B:
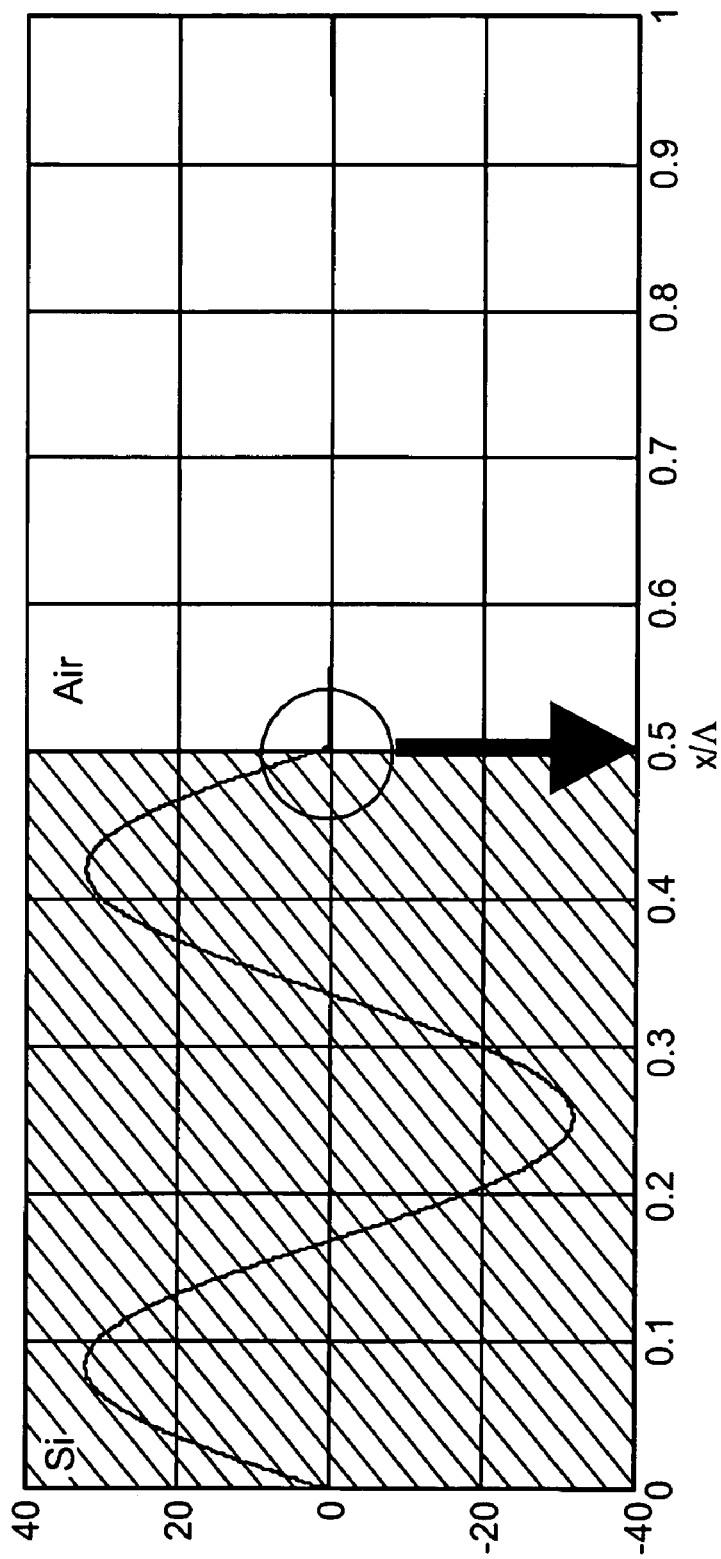
Figure 9B:
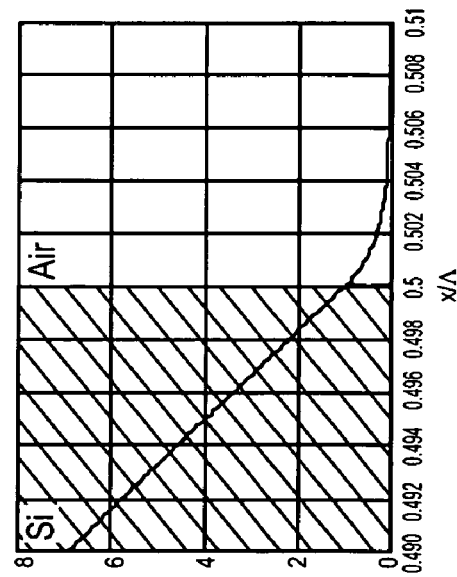

The left hand side of equation (30) is shown graphically in FIG. 8. The intersection of this curve with the line y=cos(KΛ) where −1<cos(KΛ)<1 gives the k-vectors of the Bloch modes. An example of a Bloch mode is shown as equation (31):

$$\Phi_{B,m}(x) = \quad (31)$$

$$\begin{vmatrix} \alpha_m\left[e^{-jk_{1,m}(x-n\Lambda)} + \frac{(1-A1_m)}{B1_m}e^{jk_{1,m}(x-n\Lambda)}\right] & ((n-1)\Lambda + b < x < n\Lambda) \\ \beta_m\left[e^{-jk_{2,m}(x-n\Lambda)} + \frac{(1-A2)}{B2_m}e^{jk_{2,m}(x-n\Lambda)}\right] & ((n-1)\Lambda < x < (n-1)\Lambda + b) \end{vmatrix}$$

which is graphically shown in FIG. 9, showing that the solutions for the homogeneous sections of silicon and air are continuous and differentiable at the boundary between the two regions (see inset in FIG. 9).

Solving for the refractive indices of both materials:

$$\left.\begin{matrix} n_2^2 k_0^2 = k_{2,x}^2 + k_x^2 \\ n_1^2 k_0^2 = k_{1,x}^2 + k_x^2 \end{matrix}\right\} \Rightarrow k_{2,x}^2 = (n_2^2 - n_1^2)k_0^2 + k_{1,x}^2 \quad (32)$$

This relates the k-vectors in both regions.

A Bloch mode is an exact solution to a binary diffraction grating. This allows an improvement of accuracy with respect to RCWA, which approximates this solution by way of a truncated Fourier expansion. The computational cost scales with N, the number of Bloch modes, while for RCWA, the computational cost to obtain N eigenvalues scales with $N^3$. Bloch modes also include evanescent modes. These modes normally require many orders in a Fourier expansion.

Figure 10:
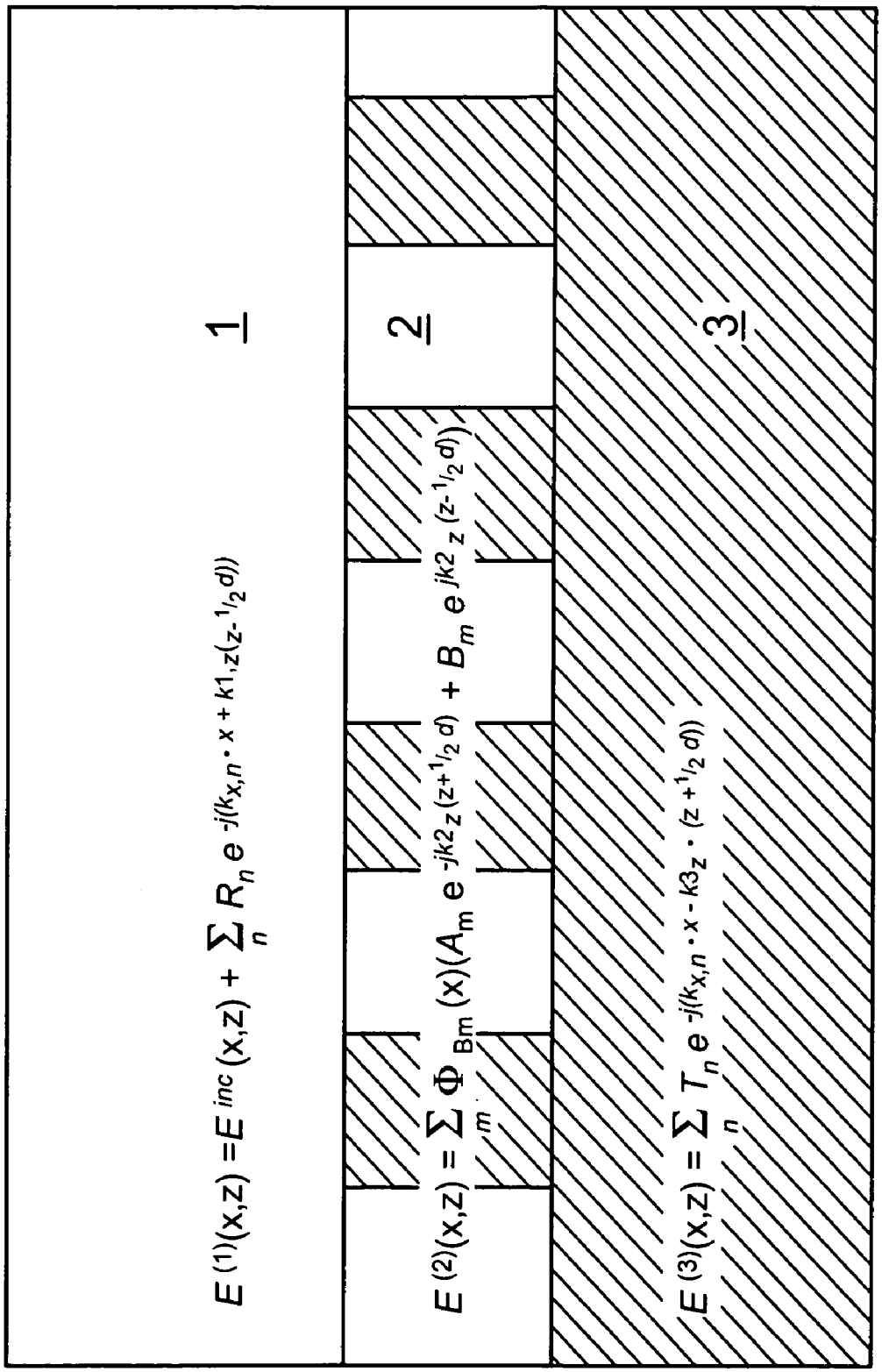
FIG. 10 depicts a solution to a binary diffraction grating according to an embodiment of the present invention.

The solution to binary diffraction gratings can be found as shown in FIG. 10. Again, the diffraction grating is divided into three sections, each with homogenous properties. Section 1 has an electric field with only the reflected beam and the incoming beam and section 3 has an electric field with only the transmitted beam. Section 2 is solved using the Bloch mode expansion. The binary grating can be solved by applying boundary conditions at z=+½d and z=−½d. For example, continuity at z=+½d gives:

$$e^{jn_1 k_0 \cos\theta \frac{1}{2} d} e^{-jk_{x,0} x} + \sum_{n=-N}^{N} R_n e^{-jk_{x,n} x} = \sum_{m=-M}^{M} \Phi_{B,m}(x)(A_m e^{-jk2,d} + B_m) \quad (33)$$

Since the left hand side and the right hand side of the equation (33) contain different functional x-dependencies, the Bloch modes are first projected onto a basis of plane waves (or vice versa). Doing this gives:

$$\Rightarrow \overline{d} + \overline{R} = \overline{\overline{C}} \cdot (\overline{\overline{X}} \cdot \overline{A} + \overline{B}) \quad (34)$$

where d is a vector describing the incoming beam, R is the vector describing the complex reflection coefficients for harmonics −N to N, X is a diagonal matrix with the phase difference between upper and lower interface $e^{(-i*k2m,z*d)}$ for each Bloch mode, A and B are the amplitude coefficients of the Bloch modes and C is the projection matrix.

$$C_{n,m} = \langle e^{-jk_{x,n} x}, \Phi_{B,m}(x) \rangle = \int_{(n-1)\Lambda}^{n\Lambda} \overline{(e^{-jk_{x,n} x})} \cdot \Phi_{B,m}(x) dx \quad (35)$$

Other boundary conditions give extra equations from which diffraction efficiencies for reflection R and transmission T can be solved.

A difference between RCWA and BME in determining the diffraction pattern that will arise from this grating is that RCWA (in the prior art) solves Maxwell equations for each slab, which boils down to finding the N eigenvalues and eigenvectors (and the greater the number of slabs, the greater the accuracy). BME, on the other hand, finds N eigenvalues for each slab. The eigenvectors (i.e. the Bloch functions) can be directly expressed as an analytical function of the eigenvalues.

An advantage of BME is that finding N eigenvalues per slab scales with N instead of $N^3$ as is the case for RCWA, so BME is inherently faster. In case of slowly varying shape parameters, the Bloch modes of subsequent slabs can be derived through $1^{st}$-order interpolation, which saves extra computation time. The $1^{st}$-order derivative can be analytically derived, while for RCWA, this also needs numerical computation. This fact can also be exploited to reduce the calculation time needed to compute the sensitivity of the diffraction efficiencies with respect to the shape parameters, which sensitivity is needed in the inversion loop. The coupling matrix allows an inspection of numerical stability and the required number of Bloch modes.

Another difference between RCWA and BME is the way in which they treat TE and TM-polarized beams. A TE-polarized beam is shown in FIG. 11a and a TM-polarized beam is shown in FIG. 11b. The RCWA solution for the TE-polarized beam in FIG. 11a is obtained by solving the wave equation (7) by a Fourier series. BME finds the exact solution by first writing down the homogeneous solutions and connecting them through the appropriate boundary conditions (5) and (6).

On the other hand, for the TM-polarized mode as shown in FIG. 11b. RCWA must find the solution to a different wave equation that has different numerical behavior.

$$n^2(x) \frac{\partial}{\partial x} \left( \frac{1}{n^2(x)} \frac{\partial H_y}{\partial x} \right) + \frac{\partial^2 H_y}{\partial z^2} + n^2(x) k_0^2 H_y = 0 \quad (36)$$

whereas the BME constructs the exact solution from connecting the solutions of two homogeneous wave equations for the H-field:

$$\left( \frac{\partial^2}{\partial x^2} + \frac{\partial^2}{\partial z^2} \right) H_y + n^2 k_0^2 H_y = 0 \quad (37)$$

which is clearly much simpler.

The boundary conditions for both are:

$$H_y^{(1)}(x=c) = H_y^{(2)}(x=c) \quad (38)$$

$$\frac{1}{n_1^2} \frac{\partial H_y^{(1)}}{\partial x} \bigg|_{(x=c)} = \frac{1}{n_2^2} \frac{\partial H_y^{(2)}}{\partial x} \bigg|_{(x=c)} \quad (39)$$

An advantage of BME is that the expressions for both TE and TM modes are the same: the Bloch mode for homogenous wave equation. The TM only differs in the numerical values of the Bloch mode and the TM solution also shows similar numerical behavior.

RCWA and BME also differ in one-dimensional conical diffraction situations. This is where the incident angle is neither parallel to or perpendicular to the grating lines and so both TE and TM modes of the incident wave need to be solved simultaneously. A conical wave is shown in FIG. 12. E is the electric field and H is the magnetic field, such that both TE and TM polarizations need to be solved.

For this incident beam on a 1D-periodic grating, RCWA needs to solve:

$$\frac{\partial}{\partial x} \left( \frac{1}{n^2(x)} \frac{\partial}{\partial x} (n^2(x) \cdot E_x) \right) + \frac{\partial^2 E_x}{\partial y^2} + \frac{\partial^2 E_x}{\partial z^2} + n^2(x) k_0^2 E_x(x, y, z) = 0 \quad (40)$$

for the TE-polarization, and $$\frac{\partial^2 H_x}{\partial x^2} + \frac{\partial^2 H_x}{\partial y^2} + \frac{\partial^2 H_x}{\partial z^2} + n^2(x) k_0^2 H_x(x, y, z) = 0 \quad (41)$$

for the TM-polarization.

The solutions for the above equations using BME are again constructed using the homogeneous solutions: Bloch modes in the x-direction and plane waves in the y- and z-directions:

$$E_x(x, y, z) = \sum_m \Phi_{B,m}(x) \cdot e^{-jk_y y} \cdot e^{-jk_z z} \quad (42)$$

where $$n_1^2 k_0^2 = k_{1,x}^2 + k_y^2 + k_z^2 \quad (43)$$

and $$H_x(x, y, z) = \sum_m \Phi_{B,m}(x) \cdot e^{-jk_y y} \cdot e^{-jk_z z} \quad (44)$$

The wave equations for the E and H-fields are similar: they are periodic in x and homogenous in y and z directions. The values for the Bloch k-vectors $k_{1,x}$ need to be derived from the boundary conditions at the interfaces in y and z.

An advantage is that BME is simpler to implement numerically and so the computation is faster than with RCWA.

Figure 13A:
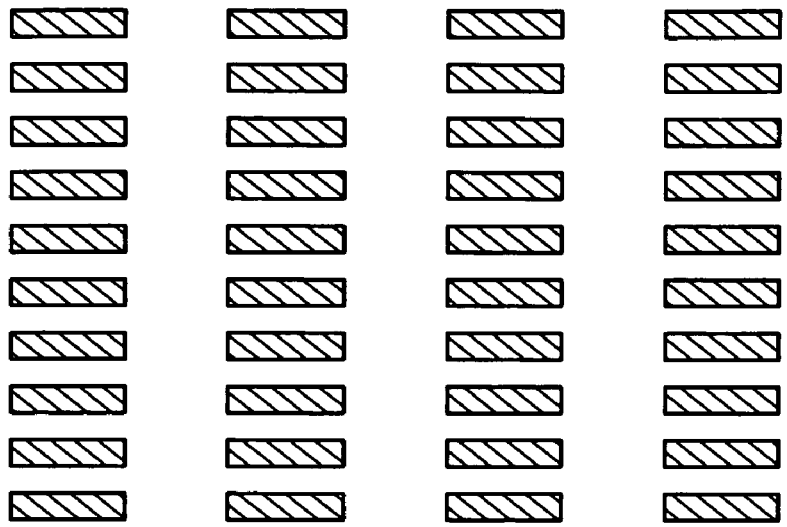
FIGS. 13a and 13b depict the application of the model to a two-dimensional periodic grating.

BME may also be more successful than RCWA in two-dimensional diffraction. This is the case where a target on a substrate comprises a two-dimensional periodic array of structures such as that shown in FIG. 13a. RCWA derives the fields $E_x$ and $E_y$ from a complicated system of two coupled partial differential equations:

$$\frac{\partial}{\partial y}\left(\frac{1}{n^2(x, y)}\frac{\partial}{\partial x}(n^2(x, y).E_x)\right) - \frac{\partial}{\partial x}\frac{\partial}{\partial y}E_x + \frac{\partial^2 E_y}{\partial x^2} + \quad (45)$$
$$\frac{\partial}{\partial y}\left(\frac{1}{n^2(x, y)}\frac{\partial}{\partial y}(n^2(x, y).E_x)\right) + \frac{\partial^2 E_y}{\partial z^2} + n^2(x, y).E_y = 0$$

$$\frac{\partial}{\partial x}\left(\frac{1}{n^2(x, y)}\frac{\partial}{\partial y}(n^2(x, y).E_y)\right) - \frac{\partial}{\partial x}\frac{\partial}{\partial y}E_y + \quad (46)$$
$$\frac{\partial}{\partial x}\left(\frac{1}{n^2(x, y)}\frac{\partial}{\partial x}(n^2(x, y).E_x)\right) + \frac{\partial^2 E_x}{\partial y^2} + \frac{\partial^2 E_x}{\partial z^2} - n^2(x, y)k_0^2 E_x = 0$$

Figure 13B:
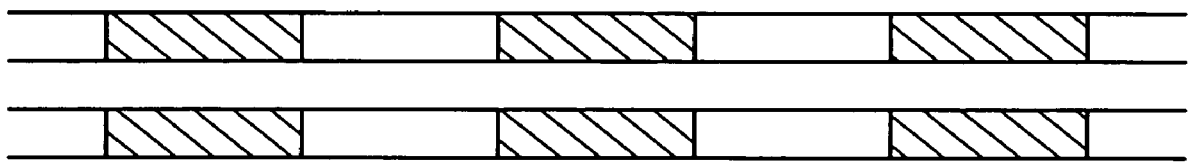

For BME, the solution can again be constructed from simple partial solutions for the periodic and homogenous rods as shown in FIG. 13b. In FIG. 13b, two periodic rods surround a single homogenous rod. The solution for the periodic rod is shown as $E_{periodic}$ in the equation (47) and the solution for the homogenous rod is shown as $E_{homogeous}$ in equation (47).

The solutions for the periodic section (equivalent to section 2 of FIG. 10) and the homogeneous sections (equivalent to sections 1 and 3 of FIG. 10) using BME are:

$$E_{periodic}(x, y, z) = \sum_m \Phi_{B,m}(x) \cdot e^{-jk_y y} \cdot e^{-jk_z z} \quad (47)$$

$$E_{homogeneous}(x, y, z) = \sum_m e^{-jk_x x} \cdot e^{-jk_y y} \cdot e^{-jk_z z}$$

An advantage of BME is that there is no requirement for a second or differential equation and their separate solutions. The application of the boundary conditions may be carried out in y and z directions and this has a strong similarity to the boundary condition in z for the 1-D periodic case.

In summary, Bloch mode expansion is a method for rigorously solving Maxwell's equation for the diffraction grating. As for RCWA, the Bloch mode expansion relies on a multi-layer decomposition of the target profile. However, BME uses the analytical solution to the binary diffraction grating, i.e. the Bloch mode. The Bloch mode is a closed expression, rather than a truncated Fourier expansion as in RCWA. Diagonalization of the slab matrix for RCWA becomes superfluous which results in strong reduction of the computation time. BME makes solving Maxwell's equations for every slab redundant. For adjacent slabs, the Bloch mode can be found through interpolation resulting in the strong reduction of computation time. The coupling of modes between adjacent layers is described by the coupling matrix (equation (34)). Inspection of the coupling matrix enables choosing the Bloch modes with the strongest coupling and correcting numerical instabilities. Bloch waves for TE and TM polarizations are identical. They only differ in mode number. This results in similar numerical stability. Conical diffraction can be more easily implemented in BME. TE and TM polarization modes can be solved in the same run without the need for solving two different differential equations as in RCWA. Modeling of two-dimensional diffraction in BME is a straightforward extension of the boundary conditions in the direction perpendicular to the grating line. There is no need for solving coupled second-order equations as in RCWA. Furthermore, the principle of eigenmode expansions can be extended to rigorous model diffraction of finite gratings. One or more of these advantages mean that computation time may be greatly reduced and the reconstruction of diffraction grating may be carried out much more quickly than previously.

When a detector detects the diffraction pattern, it forms an image made up of pixels, which, in the prior art, all carry the same weight. The problem with this is that some pixels in the image contain less information and would be better off discarded, as opposed to other pixels that are rich in information and would be better emphasized.

In order to achieve this, during the grating reconstruction, the mean-squared-error (or other suitable metric) between the measured spectrum "M" and the modelled spectrum "C" is minimized according to:

$$MSE = \langle W(M-C)^2 \rangle \quad (48)$$

where the triangular brackets denote averaging over all measured samples. W is a normalized window function that is used to emphasize certain portions of the spectrum relative to other portions of the spectrum.

This has an advantage of making a scatterometric sensor more robust and accurate by tuning the window function W.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

We claim:

1. A method of reconstructing a shape of an object from a detected diffraction pattern of radiation illuminating the object, the method comprising:
   estimating the object shape;
   deriving a model diffraction pattern from the estimated shape by
      mathematically dividing the profile of the object into a plurality of layers such that each layer contains a periodic one-dimensional series of alternating structure material and a second material,
      applying boundary conditions at each interface between the structure material and the second material, and
      determining Bloch Mode Expansion for a first layer and then extrapolating the Bloch modes for other layers assuming a small change in the relative size of the structure material and the second material from one layer to the next;
   comparing the model diffraction pattern and the detected diffraction pattern; and
   determining the actual object shape from the difference between the model diffraction pattern and the detected diffraction pattern.

2. The method of claim 1, wherein the estimated object shape is a two-dimensional periodic lattice of structures.

3. The method of claim 1, wherein the Bloch mode expansion is applied to both TE and TM polarized radiation illuminating the object.

4. The method of claim 3, wherein the Bloch mode expansion is applied to both TE and TM polarized radiation simultaneously.

5. The method of claim 1, comprising, during the comparison between the model diffraction pattern and the detected diffraction pattern, applying a mean-squared-error minimization function according to:

$$MSE = <W(M-C)^2>,$$

wherein MSE is the mean-squared-error, W is a normalized window function, M is the detected diffraction pattern and C is the model diffraction pattern.

6. A computer program product comprising a computer readable storage medium having computer readable program code embodied in the medium for causing an application program to execute on a computer a method of reconstructing the shape of an object from a detected diffraction pattern of radiation illuminating the object, the computer program product comprising:
   program code for estimating the object shape;
   program code for deriving a model diffraction pattern from the estimated shape, including
      program code for mathematically dividing the profile of the object into a plurality of layers such that each layer contains a periodic one-dimensional series of alternating structure material and a second material,
      program code for applying boundary conditions at each interface between the structure material and the second material, and
      program code for determining Bloch Mode Expansion for a first layer and then extrapolating the Bloch modes for other layers assuming a small change in the relative size of the structure material and the second material from one layer to the next;
   program code for comparing the model diffraction pattern and the detected diffraction pattern; and
   program code for determining the actual object shape from the difference between the model diffraction pattern and the detected diffraction pattern.

7. The computer program of claim 6, wherein the estimated object shape is a two-dimensional periodic lattice of structures.

8. The computer program of claim 6, wherein the Bloch mode expansion is applied to both TE and TM polarized radiation illuminating the object.

9. The computer program of claim 8, wherein the Bloch mode expansion is applied to both TE and TM polarized radiation simultaneously.

10. An inspection apparatus configured to measure a property of a substrate, comprising a recording medium having recorded thereon program code to cause a computer to:
   estimate a shape of an object of the substrate;
   derive a model diffraction pattern from the estimated shape, by
      mathematically dividing the profile of the object into a plurality of layers such that each layer contains a periodic one-dimensional series of alternating structure material and a second material,
      applying boundary conditions at each interface between the structure material and the second material, and
      determining Bloch Mode Expansion for a first layer and then extrapolating the Bloch modes for other layers assuming a small change in the relative size of the structure material and the second material from one layer to the next;
   compare the model diffraction pattern and a detected diffraction pattern of the object; and
   determine the actual object shape from the difference between the model diffraction pattern and the detected diffraction pattern.

11. The inspection apparatus of claim 10, wherein the estimated object shape is a two-dimensional periodic lattice of structures.

12. The inspection apparatus of claim 10, wherein the Bloch mode expansion is applied to both TE and TM polarized radiation illuminating the object.

13. A lithographic cell comprising a lithographic apparatus and an inspection apparatus configured to measure a property of a substrate, the inspection apparatus comprising a recording medium having recorded thereon program code to cause a computer to:

estimate an shape of an object of the substrate;
derive a model diffraction pattern from the estimated shape, by
  mathematically dividing the profile of the object into a plurality of layers such that each layer contains a periodic one-dimensional series of alternating structure material and a second material,
  applying boundary conditions at each interface between the structure material and the second material, and
  determining Bloch Mode Expansion for a first layer and then extrapolating the Bloch modes for other layers assuming a small change in the relative size of the structure material and the second material from one layer to the next;
comparing the model diffraction pattern and a detected diffraction pattern of the object; and
determine the actual object shape from the difference between the model diffraction pattern and the detected diffraction pattern.

14. The lithographic cell of claim 13, wherein the estimated object shape is a two-dimensional periodic lattice of structures.

15. The lithographic cell of claim 13, wherein the Bloch mode expansion is applied to both TE and TM polarized radiation illuminating the object.

16. The lithographic cell of claim 15, wherein the Bloch mode expansion is applied to both TE and TM polarized radiation simultaneously.

* * * * *